(12) United States Patent
Song et al.

(10) Patent No.: US 7,906,900 B2
(45) Date of Patent: Mar. 15, 2011

(54) WHITE ORGANIC LIGHT EMITTING DEVICE

(75) Inventors: Jung-bae Song, Yongin-si (KR);
Sang-yeol Kim, Yongin-si (KR);
Mu-gyeom Kim, Yongin-si (KR);
Sung-hun Lee, Yongin-si (KR)

(73) Assignees: Samsung Electronics Co., Ltd., Yeongtong-gu, Suwon-si, Gyeonggi-do (KR); Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 491 days.

(21) Appl. No.: 12/076,111

(22) Filed: Mar. 13, 2008

(65) Prior Publication Data

US 2009/0026929 A1    Jan. 29, 2009

(30) Foreign Application Priority Data

Jul. 24, 2007    (KR) .......................... 10-2007-0074123

(51) Int. Cl.
*H01J 33/04*    (2006.01)

(52) U.S. Cl. ........................................ 313/504; 313/506
(58) Field of Classification Search .......... 313/498–512; 428/690
See application file for complete search history.

(56) References Cited

U.S. PATENT DOCUMENTS

2004/0012331 A1 * 1/2004 Yamazaki et al. ............ 313/506
* cited by examiner

*Primary Examiner* — Anne M Hines
(74) *Attorney, Agent, or Firm* — Robert E. Bushnell, Esq.

(57) ABSTRACT

A white organic light emitting device (OLED) includes an anode and a cathode spaced apart from each other; a blue light emitting layer, a green light emitting layer, and a red light emitting layer sequentially formed between the anode and the cathode; a first buffer layer formed between the blue light emitting layer and the green light emitting layer, and having a HOMO (highest occupied molecular orbital)–LOMO (lowest occupied molecular orbital) energy gap higher than or equal to that of the adjacent light emitting layers; and a second buffer layer formed between the green light emitting layer and the red light emitting layer, and having a LOMO energy level higher than that of the red light emitting layer.

21 Claims, 5 Drawing Sheets

WHITE ORGANIC LIGHT EMITTING DEVICE

CROSS-REFERENCE TO RELATED PATENT APPLICATION AND CLAIM OF PRIORITY

This application claims the benefit of Korean Patent Application No. 10-2007-0074123, filed on Jul. 24, 2007, in the Korean Intellectual Property Office, the disclosure of which is incorporated herein in its entirety by reference.

BACKGROUND OF THE INVENTION

1. Field of the Invention

The present invention relates to an organic light emitting device (OLED), and more particularly, to a white OLED.

2. Description of the Related Art

Organic light emitting devices (OLEDs) emit light by combining electrons and holes in an organic light emitting layer when current or voltage is applied to the organic light emitting layer. OLEDs may have a multi-layer structure including a hole injection layer (HIL) and a hole transporting layer (HTL) disposed between an anode and an organic light emitting layer, and an electron injection layer (EIL) and an electron transporting layer (ETL) disposed between a cathode and the organic light emitting layer to obtain higher luminous efficiency.

OLEDs have the advantages of a low driving voltage of approximately 5 V, high brightness, a short response time, thin design, good color reproduction, a wide viewing angle, and easy change of color through a selection of a fluorescent material. Accordingly, OLEDs can be used in various applications including a full color display device, a backlight unit for a liquid crystal display (LCD), an information display device, an automotive display device, and an illumination device.

White OLEDs, which emit white light, have a structure in which light emitting layers emitting light of various colors are stacked. In particular, white OLEDs can be used as a paper-thin light source, a backlight unit for an LCD, and a full color display device employing a color filter. However, white OLEDs have a disadvantage in that it is difficult to control chromaticity because the light emitting layers simultaneously emit light of various colors. In detail, since the light emitting layers are different from one another in terms of the quantity of charges injected thereinto, charge mobility therein, and energy level, it is difficult to control chromaticity.

SUMMARY OF THE INVENTION

The present invention provides an improved white organic light emitting device.

Embodiments of the present invention provides a white organic light emitting device (OLED) that can improve color reproduction and luminous efficiency by facilitating chromaticity control.

According to an aspect of the present invention, there is provided a white OLED (organic light emitting device) comprising: an anode and a cathode spaced apart from each other; blue, green, and red light emitting layers sequentially formed between the anode and the cathode; a first buffer layer formed between the blue light emitting layer and the green light emitting layer, and having a HOMO (highest occupied molecular orbital)–LOMO (lowest occupied molecular orbital) energy gap higher than or equal to that of the adjacent light emitting layers; and a second buffer layer formed between the green light emitting layer and the red light emitting layer, and having a LOMO energy level higher than that of the red light emitting layer.

The first buffer layer may have both hole transport characteristics and electron transport characteristics, in which the electron transport characteristics are higher than the hole transport characteristics. The second buffer layer may have hole transport characteristics, and electron blocking characteristics limiting the number of electrons injected from the red light emitting layer.

Each of the first and second buffer layers may have a thickness of 1 to 4 nm.

The first buffer layer may be formed of the same material as a host material used for the blue light emitting layer.

The white OLED may further comprise an HTL (hole transporting layer) formed between the anode and the blue light emitting layer. The second buffer layer may be formed of the same material as that of the HTL. The HTL may be formed of TPD(N,N'-diphenyl-N,N'-bis(3-methylphenyl)-1,1'-biphenyl-4,4'-diamine) or NPB(N,N'-di(naphthalen-1-yl)-N,N'-diphenyl-benzidine).

The white OLED may further comprise an HIL (hole injection layer) formed between the anode and the HTL. The HIL may be formed of MTDATA(4,4',4"-tris(3-methylphenylphenylamino)triphenylamine), CuPc(copper phthalocyanine) or PEDOT/PSS(poly(3,4-ethylenedioxythiphene, polystyrene sulfonate).

The blue light emitting layer and the green light emitting layer may be formed respectively using host materials and blue and red dopants. Each of the host materials may be an anthracene derivative, a pyrene derivative, and/or a perylene derivative.

The red light emitting layer may be formed using a phosphorescent host material and a red dopant. The phosphorescent host material may be formed of a carbazole-based compound or a metal complex. The carbazole-based compound may be one selected from the group consisting of CBP(4,4-N,N'-dicarbazole-biphenyl), a CBP derivative, mCP(N,N'-dicarbazolyl-3,5-benzene), and a mCP derivative. The metal complex may be a ZnPBO (phenyloxazole) complex or a ZnPBT (phenylthiazole) complex. The red dopant may be formed of an Ir complex or a Pt complex.

The white OLED may further comprise an ETL (electron transporting layer) formed between the red light emitting layer and the cathode. The ETL may be formed of one selected from the group consisting of oxadiazole, triazole, phenanthroline, benzoxazole, and benzthiazole.

The white OLED may further comprise an EIL (electron injection layer) formed between the ETL and the cathode. The EIL may be formed of LIF or LiQ (lithium quinolate).

The anode is formed of a transparent conductive material such as ITO(Indium Tin Oxide), IZO(Indium Zinc Oxide), $SnO_2$, or ZnO. The cathode may be formed of at least one metal such as Al, Ag, Mg, Li, and Ca.

According to an aspect of the present invention, there is provided a white organic light emitting device which includes an anode; a hole transporting layer formed on the anode, the hole transporting layer formed of TPD(N,N'-diphenyl-N,N'-bis(3-methylphenyl)-1,1'-bi-phenyl-4,4'-diamine) or NPB (N,N'-di(naphthalen-1-yl)-N,N'-diphenyl-benzidine); a blue light emitting layer formed on the hole transporting layer, the blue light emitting layer comprised of a blue dopant and at least one fluorescent host material selected from the group consisting of an anthracene derivative, a pyrene derivative, and a perylene derivative; a first buffer layer formed on the blue light emitting layer, the first buffer layer formed of at least one selected from the group consisting of an anthracene derivative, a pyrene derivative, and a perylene derivative; a green light emitting layer formed on the first buffer layer; a second buffer layer formed on the green light emitting layer, the second buffer layer formed of TPD(N,N'-diphenyl-N,N'-bis(3-methylphenyl)-1,1'-bi-phenyl-4,4'-diamine) or NPB (N,N'-di(naphthalen-1-yl)-N,N'-diphenyl-benzidine); a red light emitting layer formed on the second buffer layer; an electron transporting layer formed on the red light emitting layer; and a cathode formed on the electron transporting layer.

BRIEF DESCRIPTION OF THE DRAWINGS

A more complete appreciation of the invention, and many of the attendant advantages thereof, will be readily apparent as the same becomes better understood by reference to the following exemplary embodiments when considered in conjunction with the accompanying drawings in which like reference symbols indicate the same or similar components, wherein.

DETAILED DESCRIPTION OF THE INVENTION

Figure 1:
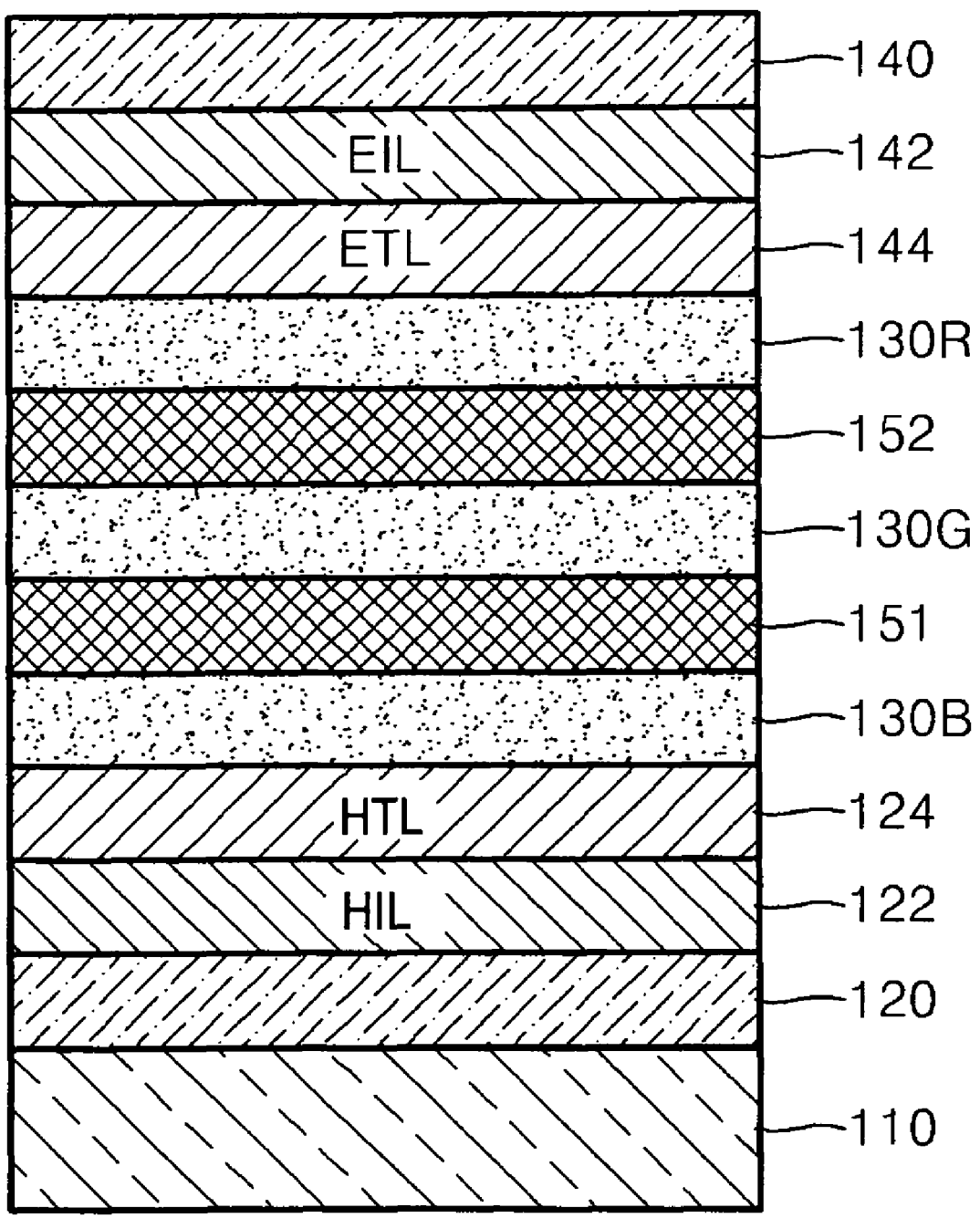
FIG. 1 is a cross-sectional view of a white organic light emitting device (OLED) according to an embodiment of the present invention.

The present invention will now be described more fully with reference to the accompanying drawings, in which exemplary embodiments of the invention are shown. In the drawings, the same reference numerals denote the same elements, and the sizes or thicknesses of constituent elements may be exaggerated for clarity throughout.

Figure 2:
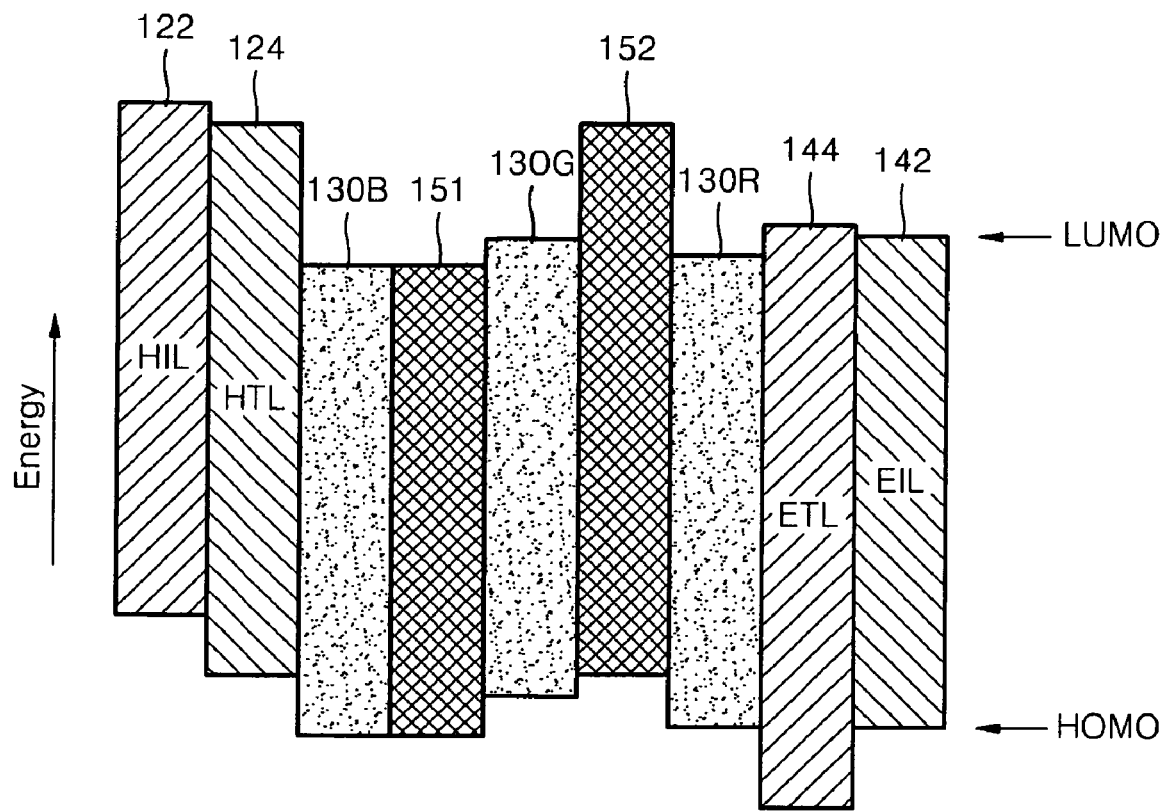
FIG. 2 illustrates the energy levels of material layers of the white OLED of FIG. 1.

FIG. 1 is a cross-sectional view of a white organic light emitting device (OLED) according to an embodiment of the present invention. FIG. 2 illustrates the energy levels of materials layers of the white OLED of FIG. 1.

Referring to FIG. 1, the white OLED includes, an anode 120 and a cathode 140 spaced apart from each other, a blue light emitting layer 130B, a green light emitting layer 130G, and a red light emitting layer 130R sequentially formed between the anode 120 and the cathode 140, a first buffer layer 151 formed between the blue light emitting layer 130B and the green light emitting layer 130G, and a second buffer layer 152 formed between the green light emitting layer 130G and the red light emitting layer 130R.

The anode 120 may be formed by depositing a transparent conductive material on a substrate 110 and patterning the transparent conductive material. The substrate 110 may be a glass substrate or a transparent plastic substrate. The anode 120 may be formed of a transparent material with high conductivity and a high work function. For example, the anode 120 may be formed of indium tin oxide (ITO), indium zinc oxide (IZO), $SnO_2$, or ZnO.

A hole injection layer 122 (HIL) for easy hole injection may be formed on the anode 120. The HIL 122 may be formed of MTDATA(4,4',4"-tris(3-methylphenylphenylamino)triphenylamine), CuPc(copper phthalocyanine) or PEDOT/PSS (poly(3,4-ethylenedioxythiphene, polystyrene sulfonate). However, the present embodiment is not limited thereto.

A hole transporting layer (HTL) 124 for easy hole transportation may be formed on the HIL 122. The HTL 124 may be formed of TPD(N,N'-diphenyl-N,N'-bis(3-methylphenyl)-1,1'-bi-phenyl-4,4'-diamine) or NPB(N,N'-di(naphthalen-1-yl)-N,N'-diphenyl-benzidine). However, the present embodiment is not limited thereto.

The blue light emitting layer 130B may be formed on the HTL 124. The blue light emitting layer 130B may be formed using a host material and a blue dopant. The host material used for the blue light emitting layer 130B may be a fluorescent host material such as an anthracene derivative, a pyrene derivative, and a perylene derivative. However, the present embodiment is not limited thereto.

The first buffer layer 151 may be formed on the blue light emitting layer 130B. The first buffer layer 151 is formed between the blue light emitting layer 130B and the green light emitting layer 130G and increases blue light intensity and reduces green light intensity and red light intensity. In FIG. 1, the first buffer layer 151 may be formed of a material that has both hole transport characteristics and electron transport characteristics in which the electron transport characteristics are higher than the hole transport characteristics. The first buffer layer 151 is formed of a material having a highest occupied molecular orbital (HOMO)–lowest occupied molecular orbital (LOMO) energy gap higher than or equal to that of the adjacent light emitting layers, that is, the blue light emitting layers 130B and the green light emitting layers 130G. Accordingly, a reduction in luminous efficiency can be prevented. For example, the first buffer layer 151 may be formed of the same material as the host material used for the blue light emitting layer 130B. However, the present embodiment is not limited thereto. The first buffer layer 151 may have a thickness of 1 to 4 nm. Since the first buffer layer 151 is formed between the blue light emitting layer 130B and the green light emitting layer 130G, the electron transport characteristics can be maintained and the number of holes traveling from the anode 120 to the cathode 140 can be reduced, thereby increasing blue light intensity and reducing green light intensity and red light intensity.

The green light emitting layer 130G may be formed on the first buffer layer 151. The green light emitting layer 130G may be formed using a host material and a green dopant. The host material used for the green light emitting layer 130G may be the same material as the host material used for the blue light emitting layer 130B, that is, may be a fluorescent host material such as an anthracene derivative, a pyrene derivative, and a perylene derivative. However, the present embodiment is not limited thereto.

The second buffer layer 152 may be formed on the green light emitting layer 130G. The second buffer layer 152 is formed between the green light emitting layer 130G and the red light emitting layer 130R and increases red light intensity and reduces blue light intensity and green light intensity. To this end, the second buffer layer 152 may be formed of a material having hole transport characteristics, and electron blocking characteristics limiting or reducing the quantity of the electrons injected from the red light emitting layer 130R. That is, while the electrons injected from the red light emitting layer 130R are passing through the second buffer layer 152 having the electron blocking characteristics, the quantity of the electrons transported to the green light emitting layer 130G is reduced or limited. The second buffer layer 152 may be formed of a material having a LOMO energy level higher than that of the red light emitting layer 130R as shown in FIG. 2. In detail, the second buffer layer 152 may be formed of the same material as that of the HTL 124. For example, the second buffer layer 152 may be formed of TPD(N,N'-diphenyl-N,N'-bis(3-methylphenyl)-1,1'-bi-phenyl-4,4'-diamine) or NPB(N,N'-di(naphthalen-1-yl)-N,N'-diphenyl-benzidine). However, the present embodiment is not limited thereto. The second buffer layer 152 may have a thickness of 1 to 4 nm.

The red light emitting layer 130R may be formed on the second buffer layer 152. The red light emitting layer 130R may be formed using a host material and a red dopant. The host material used for the red light emitting layer 130R may be a phosphorescent host material formed of a carbazole-based compound or a metal complex. The carbazole-based compound may include CBP(4,4-N,N'-dicarbazole-biphenyl), a CBP derivative, mCP(N,N'-dicarbazolyl-3,5-benzene), or a mCP derivative. The metal complex may include a ZnPBO(phenyloxazole) complex or a ZnPBT(phenylthiazole) complex. The red dopant may be a formed of an Ir complex or a Pt complex. However, the present embodiment is not limited thereto.

An electron transporting layer (ETL) 144 for easy electron transportation may be formed on the red light emitting layer 130R. The ETL 144 may be formed of one selected from the group consisting of oxadiazole, triazole, phenanthroline, benzoxazole, and benzthiazole. However, the present embodiment is not limited thereto. An electron injection layer (EIL) 142 for easy electron injection may be formed on the ETL 144. The EIL 142 may be formed of LIF or lithium quinolate (LiQ). However, the present embodiment is not limited thereto.

The cathode 140 may be formed on the EIL 142. The cathode 140 may be formed of a metal with a low work function. For example, the cathode 140 may be formed of Al, Ag, Mg, Li, Ca, or an alloy thereof. However, the present embodiment is not limited thereto.

As described above, since the first buffer layer 151 is formed between the blue light emitting layer 130B and the green light emitting layer 130G to increase blue light intensity and reduce green light intensity and red light intensity and the second buffer layer 152 is formed between the green light emitting layer 130G and the red light emitting layer 130R to increase red light intensity and reduce blue light intensity and green light intensity, the white OLED can obtain desired blue, green, and red light intensity, satisfy desired color coordinates, and prevent a reduction in luminous efficiency. Hence, since chromaticity control is facilitated, the white OLED can improve color reproduction and achieve high efficiency.

Figure 3:
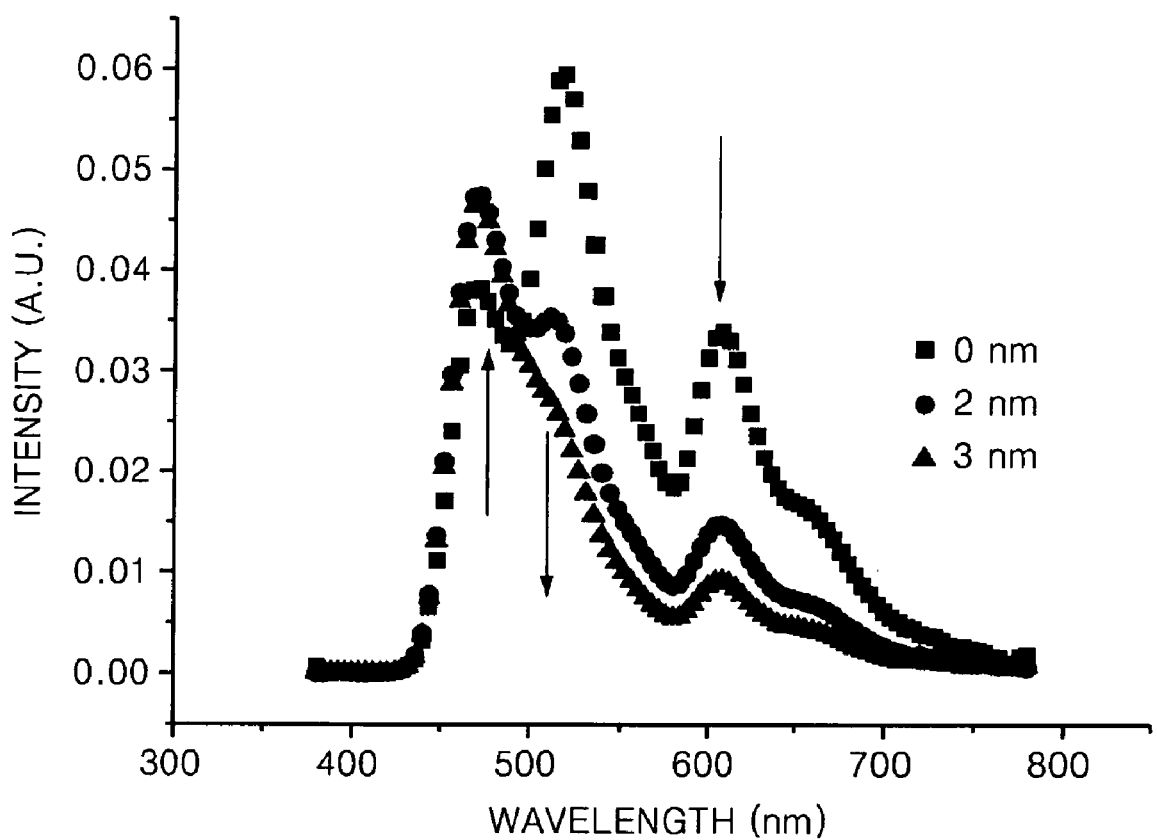
FIG. 3 is a graph illustrating the emission spectrum of a white OLED having only a first buffer layer formed between a blue light emitting layer and a green light emitting layer.
Figure 4:
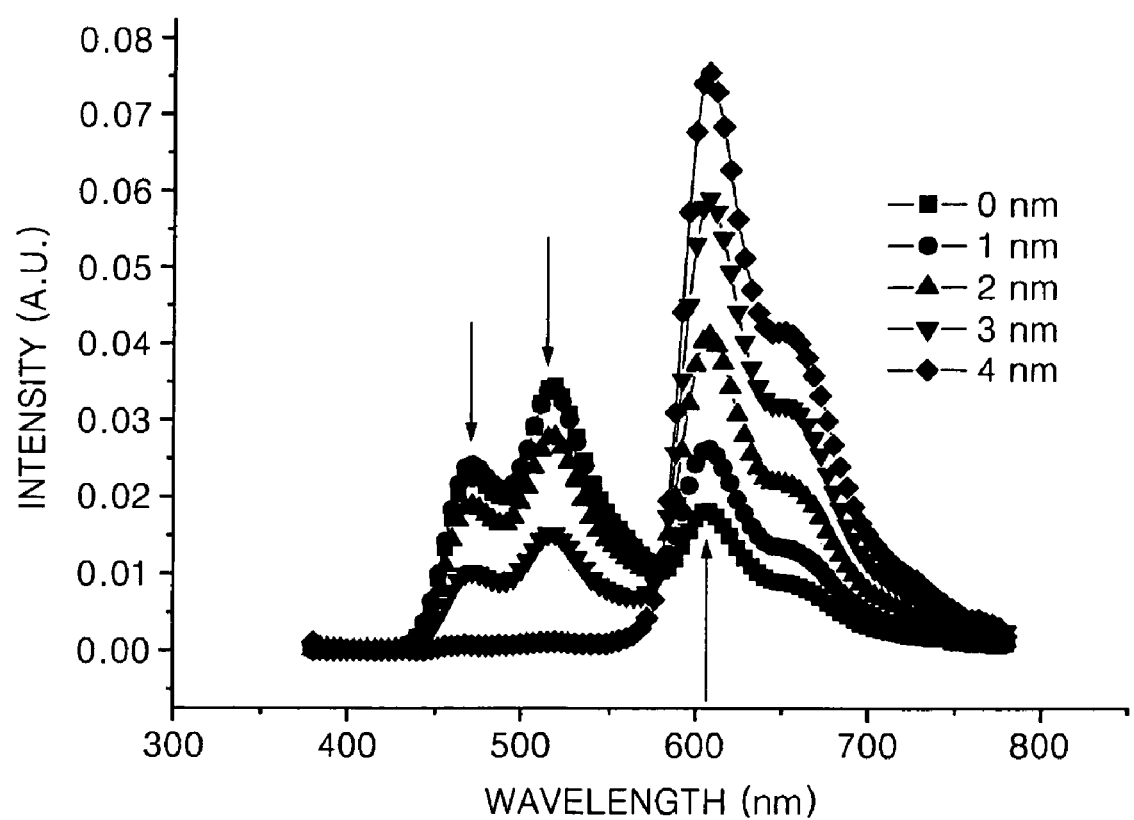
FIG. 4 is a graph illustrating the emission spectrum of a white OLED having only a second buffer layer formed between a green light emitting layer and a red light emitting layer.

FIG. 3 is a graph illustrating the emission spectrum of a white OLED having only a first buffer layer formed between a blue light emitting layer and a green light emitting layer. FIG. 3 shows emission spectrums when the thickness of the first buffer layer is 0 nm, 2 nm, and 3 nm. Referring to FIG. 3, as the thickness of the first buffer layer increases, green light intensity and red light intensity decrease and blue light intensity increases. FIG. 4 is a graph illustrating the emission spectrum of a white OLED having only a second buffer layer formed between a green light emitting layer and a red light emitting layer. FIG. 4 illustrates emission spectrums when the thickness of the second buffer layer is 0 nm, 1 nm, 2 nm, 3 nm, and 4 nm. Referring to FIG. 4, as the thickness of the second buffer layer increases, blue light intensity and green light intensity decrease and red light intensity increases.

Figure 5:
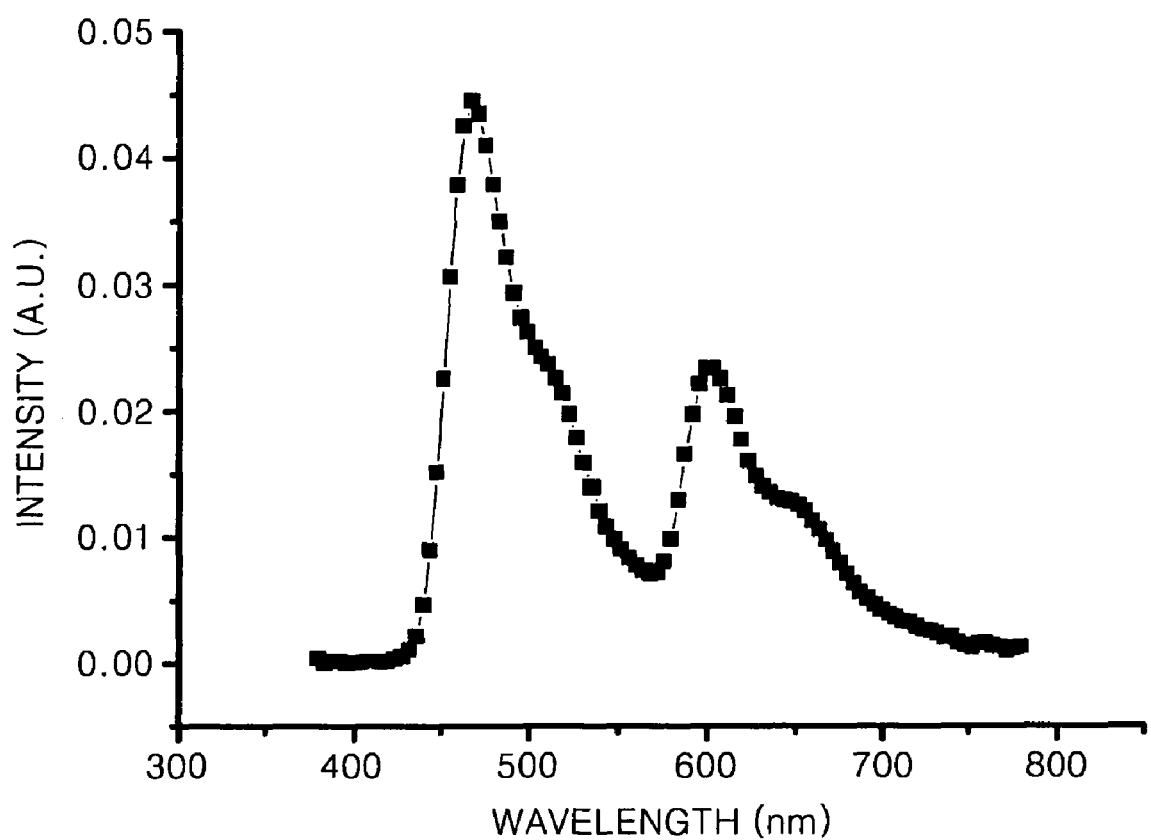
FIG. 5 is a graph illustrating the emission spectrum of the white OLED of FIG. 1.

FIG. 5 is a graph illustrating the emission spectrum of the white OLED of FIG. 1 having both the first buffer layer 151 formed between the red light emitting layer 130B and the green light emitting layer 130G and the second buffer layer 152 formed between the green light emitting layer 130g and the red light emitting layer 130R. Referring to FIG. 5, the white OLED can obtain desired blue, green, and red light intensity. Accordingly, since chromaticity control is facilitated, the white OLED can improve color reproduction and achieve high efficiency.

As described above, since the first buffer layer is formed between the blue light emitting layer and the green light emitting layer to increase blue light intensity and reduce green light intensity and red light intensity and the second buffer layer is formed between the green light emitting layer and the red light emitting layer to increase red light intensity and reduce blue light intensity and green light intensity, the white OLED can obtain desired blue, green, and red light intensity, satisfy desired color coordinates, and prevent a reduction in luminous efficiency. Hence, since chromaticity control is easy, color reproduction can be improved and highly efficient white OLED can be realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white OLED (organic light emitting device) comprising:
    an anode;
    a cathode spaced apart from the anode;
    a blue light emitting layer formed between the anode and the cathode;
    a green light emitting layer formed between the blue light emitting layer and the cathode;
    a red light emitting layer formed between the green light emitting layer and the cathode;
    a first buffer layer formed between the blue light emitting layer and the green light emitting layer, the first buffer layer having a HOMO (highest occupied molecular orbital)–LOMO (lowest occupied molecular orbital) energy gap higher than or equal to a HOMO–LOMO energy gap of the blue light emitting layer and the green light emitting layer, the first buffer layer having both hole transport characteristics and electron transport characteristics higher than the hole transport characteristics; and
    a second buffer layer formed between the green light emitting layer and the red light emitting layer, the second buffer layer having a LOMO energy level higher than a LOMO energy level of the red light emitting layer, the second buffer layer having hole transport characteristics and reducing the quantity of the electrons to be transported from the red light emitting layer to the green light emitting layer.

2. The white OLED of claim 1, wherein each of the first and second buffer layers has a thickness of 1 to 4 nm.

3. The white OLED of claim 1, wherein the blue light emitting layer is formed of a host material and a blue dopant, and the first buffer layer is formed of the same material as the host material of the blue light emitting layer.

4. The white OLED of claim 1, further comprising a hole transporting layer formed between the anode and the blue light emitting layer.

5. The white OLED of claim 4, wherein the second buffer layer is formed of the same material as the material of the hole transporting layer.

6. The white OLED of claim 4, wherein the second buffer layer is formed of TPD(N,N'-diphenyl-N,N'-bis(3-methylphenyl)-1,1'-bi-phenyl-4,4'-diamine) or NPB(N,N'-di (naphthalen-1-yl)-N,N'-diphenyl-benzidine).

7. The white OLED of claim 4, further comprising a hole injection layer formed between the anode and the hole transporting layer.

8. The white OLED of claim 7, wherein the hole injection layer is formed of MTDATA(4,4',4"-tris(3-methylphenylphenylamino)triphenylamine), CuPc(copper phthalocyanine) or PEDOT/PSS(poly(3,4-ethylenedioxythiphene, polystyrene sulfonate).

9. The white OLED of claim 1, wherein the blue light emitting layer and the green light emitting layer are formed respectively using host materials and blue and green dopants, and each of the host materials is formed of at least one selected from the group consisting of an anthracene derivative, a pyrene derivative, and a perylene derivative.

10. The white OLED of claim 1, wherein the red light emitting layer is formed of a phosphorescent host material selected from the group consisting of a carbazole-based compound and a metal complex, and a red dopant.

11. The white OLED of claim 10, wherein the carbazole-based compound is selected from the group consisting of CBP(4,4-N,N'-dicarbazole-biphenyl), a CBP derivative, mCP(N,N'-dicarbazolyl-3,5-benzene), and a mCP derivative, and the metal complex is a ZnPBO(phenyloxazole) complex or a ZnPBT(phenylthiazole) complex.

12. The white OLED of claim 10, wherein the red dopant is formed of an Ir complex or a Pt complex.

13. The white OLED of claim 1, further comprising an electron transporting layer formed between the red light emitting layer and the cathode.

14. The white OLED of claim 13, wherein the electron transporting layer is formed of one selected from the group consisting of oxadiazole, triazole, phenanthroline, benzoxazole, and benzthiazole.

15. The white OLED of claim 13, further comprising an electron injection layer formed between the electron transporting layer and the cathode.

16. The white OLED of claim 15, wherein the electron injection layer is formed of LIF or LiQ (lithium quinolate).

17. A white OLED comprising:
an anode;
a hole transporting layer formed on the anode;
a blue light emitting layer formed on the hole transporting layer;
a first buffer layer formed on the blue light emitting layer, the first buffer layer having a HOMO–LOMO energy gap higher than or equal to HOMO–LOMO energy gaps of the blue light emitting layer and a green light emitting layer, the first buffer layer having both hole transport characteristics and electron transport characteristics higher than the hole transport characteristics;
the green light emitting layer formed on the first buffer layer;
a second buffer layer formed on the green light emitting layer, the second buffer layer having a LOMO energy level higher than a LOMO energy level of a red light emitting layer, the second buffer layer having hole transport characteristics and reducing the quantity of the electrons to be transported from the red light emitting layer to the green light emitting layer;
the red light emitting layer formed on the second buffer layer;
an electron transporting layer formed on the red light emitting layer; and
a cathode formed on the electron transporting layer.

18. The white OLED of claim 17, wherein the blue light emitting layer is formed of a host material and a blue dopant, and the first buffer layer is formed of the same material as the host material of the blue light emitting layer.

19. The white OLED of claim 17, wherein the second buffer layer is formed of the same material as the hole transporting layer.

20. The white OLED of claim 17, wherein each of the first and second buffer layers has a thickness of 1 to 4 nm.

21. The white OLED of claim 17, further comprising at least one of a hole injection layer formed between the anode and the hole transporting layer and an electron injection layer formed between the electron transporting layer and the cathode.

* * * * *